(12) United States Patent
Menguc et al.

(10) Patent No.: US 11,107,948 B1
(45) Date of Patent: Aug. 31, 2021

(54) FLUIDIC PICK-UP HEAD FOR ASSEMBLING LIGHT EMITTING DIODES

(71) Applicant: Facebook Technologies, LLC, Menlo Park, CA (US)

(72) Inventors: Yigit Menguc, Kirkland, WA (US); Pooya Saketi, Cork (IE); Thomas John Farrell Wallin, Redmond, WA (US); Nicholas Roy Corson, Woodinville, WA (US); Ali Sengül, Zurich (CH); Katherine Healy, Redmond, WA (US); Oscar Torrents Abad, Cork (IE); Daniel Brodoceanu, Cork (IE); Robert Manson, Seattle, WA (US); Leif-Erik Sharif Simonsen, Kirkland, WA (US); Remi Alain Delille, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 22 days.

(21) Appl. No.: 16/700,354

(22) Filed: Dec. 2, 2019

(51) Int. Cl.
*H01L 33/06* (2010.01)
*H01L 25/075* (2006.01)
*H01L 21/683* (2006.01)

(52) U.S. Cl.
CPC .......... *H01L 33/06* (2013.01); *H01L 21/6835* (2013.01); *H01L 25/0753* (2013.01)

(58) Field of Classification Search
CPC .. H01L 33/06; H01L 25/0753; H01L 21/6835
USPC .......................................................... 257/13
See application file for complete search history.

(56) References Cited

U.S. PATENT DOCUMENTS

2018/0351030 A1* 12/2018 Goward ................. H01L 24/95

* cited by examiner

*Primary Examiner* — Vu A Vu
(74) *Attorney, Agent, or Firm* — Fenwick & West LLP

(57) ABSTRACT

A method and system for assembling a device by picking up semiconductor devices from a carrier substrate and placing the semiconductor devices onto a target substrate. The transfer of the semiconductor devices uses fluid as a transfer medium. The fluid enters a fluid channel of a pickup head, causing the pickup head to expand, make contact with, and attach to an aligned semiconductor device. After the semiconductor device is aligned with and placed onto the target substrate, at least a portion of the fluid is removed from the pickup head to release the semiconductor device onto the target substrate. The semiconductor device bonds to the target substrate.

15 Claims, 9 Drawing Sheets

FLUIDIC PICK-UP HEAD FOR ASSEMBLING LIGHT EMITTING DIODES

BACKGROUND

The present invention relates to a pick-up head and assembly process picking up and placing small semiconductor devices, and more specifically to using a pick-up head operated by fluid to pick up and place micro light emitting diodes (micro-LED).

Small semiconductor devices may be moved from one substrate to another. For example, micro-LEDs emitting different colors may be transferred from carrier substrates to a display substrate including control circuits for the micro-LEDs to manufacture an electronic display. As the form factor of semiconductor devices decreases, the picking and placing of the semiconductor devices into desired arrangements without damaging the semiconductor devices becomes increasingly difficult.

SUMMARY

Embodiments relate to using fluidics to operate a pickup head to move semiconductor devices from one substrate to another substrate. Applying of fluid to a channel of the pickup head of a pickup head array is controlled to expand or contract the pickup head for contacting or retracting the pickup head relative to a semiconductor device. When the pick-up head expands, the semiconductor device contact and attaches to the pickup head.

In one or more embodiments, the semiconductor device is removed from a carrier substrate after the pickup head is lifted with the semiconductor device attached, away from the carrier substrate. The fluid is removed from the channel of the pickup head to contact the pickup head, and thereby, separate the semiconductor device from the pickup head.

In some embodiments, the pickup head array includes a housing formed with a fluid channel and the pickup head array at the side of the housing. The pickup head is formed with a cavity that connects with the fluid channel and receive fluid via the fluidic channel.

The figures depict embodiments of the present disclosure for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments relate to the picking and placing of semiconductor devices from a carrier substrate to a target substrate after the semiconductor devices are fabricated using a fluid-activated pickup head of a pickup head array. The pickup head expands and attaches to each semiconductor device. For this purpose, fluid is injected through a channel of the pickup head, enabling the pickup head to expand, contact, and attach to the semiconductor device. After the pickup head attaches the semiconductor device, the pickup head moves the semiconductor device onto the target substrate.

Example Semiconductor

Figure 1:
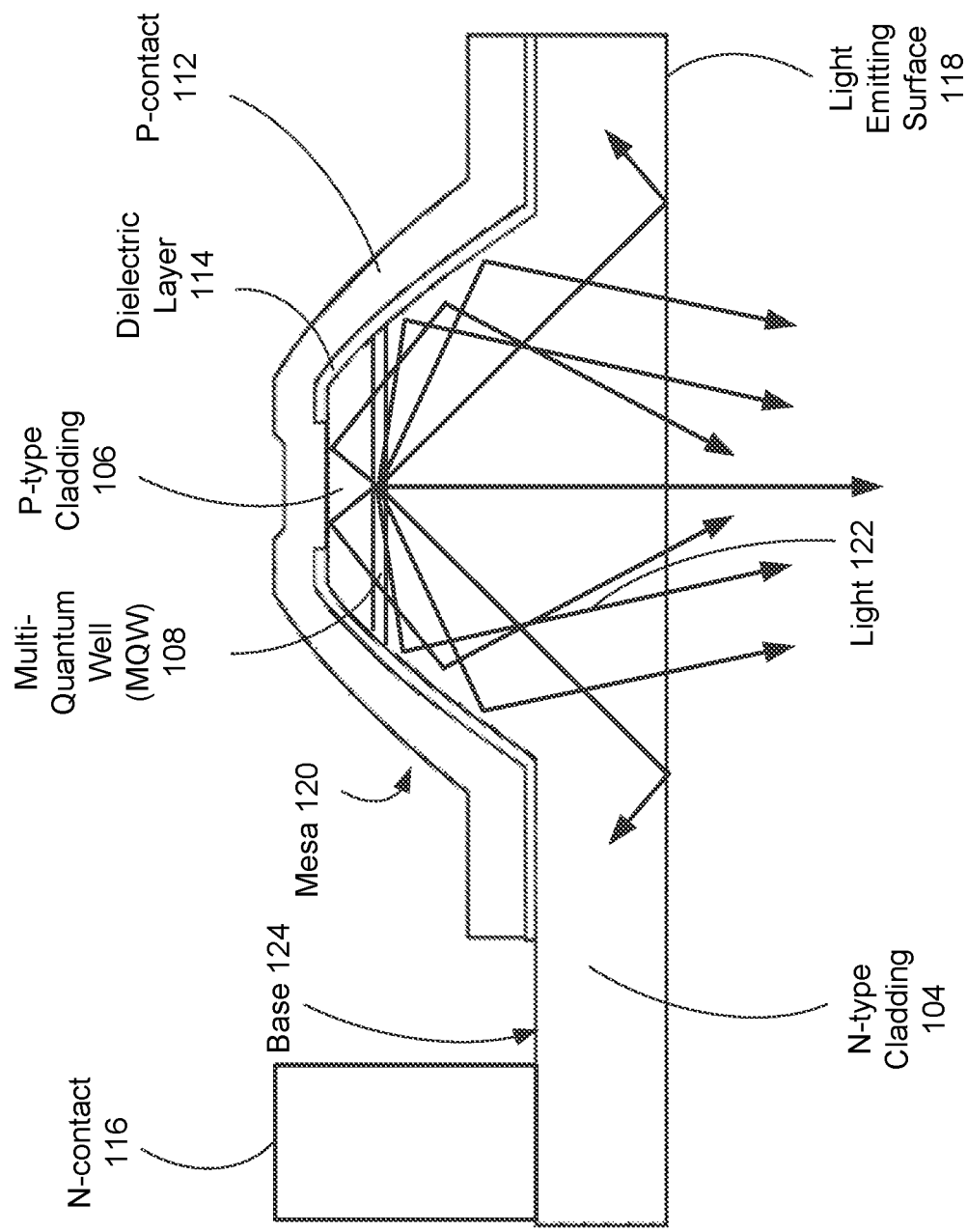
FIG. 1 illustrates a cross-sectional view of a light emitting diode (LED), in accordance with an embodiment.

FIG. 1 illustrates a cross-sectional view of a LED 100, in accordance with an embodiment. The LED 100 is an example of a semiconductor device. In some embodiments, the LED 100 may be a micro LED. In some embodiments, the feature size of the micro LED (e.g., the diameter) may range from sub-micrometers to tens of micrometers (e.g., from 0.1 μm to 10 μm) and have a small active light emitting area (e.g., less than 2,000 μm$^2$). The collimated light output increases the brightness level of light emitted from the small active light emitting area. The micro LED may be one of many micro LEDs of an array on a target substrate, with the pitch (e.g., spacing between micro LEDs) ranging from sub-micrometers to tens of micrometers.

The LED 100 may include, among other components, a semiconductor structure including an n-type cladding 104, a p-type cladding 106, and a multi-quantum well ("MQW") 108 between the n-type cladding 104 and the p-type cladding 106. The LED 100 further includes a dielectric layer 114 on the semiconductor structure, a p-contact 112 on the dielectric layer 114, and an n-contact 116 on the n-type cladding 104. The semiconductor structure is shaped, such as via an etch process, into a mesa 120 and a base 124 of the mesa 120. The p-type cladding 106 defines the top of the mesa 120, and the n-type cladding 104 defines a portion of the mesa 120 and the base 124. In some embodiments, an n-type cladding defines the top portion of the mesa 120 and a p-type cladding defines the bottom portion of the mesa 120 and the base 124. Here, the p-contact 112 is an n-contact and the n-contact 116 is a p-contact.

The multi-quantum well 108 defines an active light emitting area that is included in the structure of the mesa 120. The LED 100 may include one or more quantum wells. The mesa 120 may include a truncated top defined on a side opposed to a light emitting surface 118 of the LED 100. In some embodiments, the semiconductor structure including the n-type cladding 104, MQW 108, and p-type cladding 106 is an epitaxial structure grown on a growth substrate.

The mesa 120 may include various shapes, such as a parabolic shape with a truncated top, to form a reflective enclosure for light 122 generated within the LED 100. In other embodiments, the mesa 120 may include a cylindrical shape with a truncated top, or a conic shape with a truncated top, or some other light-collimating shape. The arrows show how the light 122 emitted from the MQW 108 is reflected off the p-contact 112 and internal walls of the mesa 120 toward the light emitting surface 118 at an angle sufficient for the light to escape the LED 100 (i.e., within a critical angle of total internal reflection). The p-contact 112 and the n-contact 116 are examples of contacts of the semiconductor device 100, and electrically connect the LED 100, such as to a display substrate including a control circuit for the LED 100. The n-contact 116 is formed at the base 124, which is defined by a surface of the n-type cladding 106 opposite the light emitting surface 118. The n-contact 116 may include a conductive material that extends to the top of the mesa 120 to support the placement of the LED 100 on the display substrate with the p-contact 112 and the n-contact 116 bonded to the display substrate.

The LED 100 may include an active light emitting area defined by the MQW 108. The LED 100 directionalizes the light output from the MQW 108 and increases the brightness level of the light output. In particular, the p-contact 112 may be reflective for the light 122 emitted from the MQW 108. The mesa 120 and p-contact 112 cause reflection of the light 122 from the MQW 108 to form a collimated or quasi-collimated light beam emerging from the light emitting surface 118.

The mesa 120 may be formed by etching into the semiconductor structure including the n-type cladding 104, the MQW 108, and the p-type cladding 106, during wafer processing steps. The etching results in the MQW 108 being in the structure of the mesa 120, and at a particular distance to the p-contact 112 to facilitate the collimation of the light 122. In some embodiments, the MQW 108 is at a parabola focal point defined by the parabolic shape of the mesa 120. A portion of the generated light 122 is reflected at the mesa 120 to form the quasi-collimated light beam emitted from the light emitting surface 118.

While this application discusses primarily micro LEDs, in other embodiments the LEDs 100 may comprise any semiconductor devices operable by providing electric signals.

Example Process of Semiconductor Device Pickup and Placement

Figure 2A:
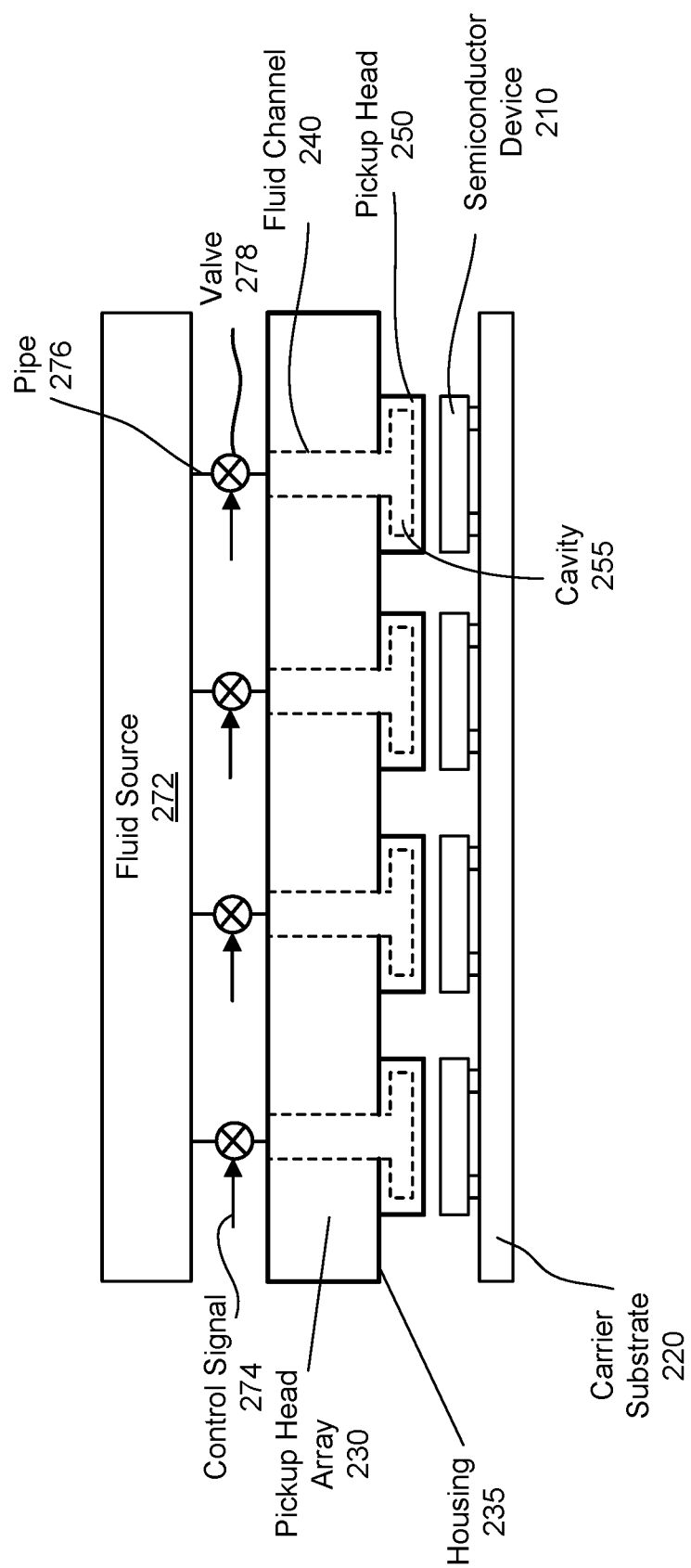
FIG. 2A is a cross-sectional view of semiconductor devices on a carrier substrate and a pickup head array with pick-up heads in a contracted state, in accordance with an embodiment.

FIG. 2A is a cross-sectional view of semiconductor devices on a carrier substrate and a pickup head array with pick-up heads in a contracted state, in accordance with an embodiment. The semiconductor devices 210 are fabricated on a native substrate and then transferred onto a carrier substrate 220. The carrier substrate 220 may then be moved to a device or facility (e.g., the display assembly system 400 illustrated in FIG. 4) different from the device or facility where the semiconductor devices 210 are fabricated. The semiconductor devices 210 may be singulated after or before the semiconductor devices 210 are placed onto the carrier substrate 220.

The pickup head array 230 is operated to pick up one or more of the semiconductor devices 210 from the carrier substrate 220 and transfer the picked up semiconductors 210 onto a target substrate 275. The pickup head array 230 includes one or more pick heads 250, a housing 235 shared across the pickup heads 250 and fluid channels 240 formed in the housing.

Each pickup head 250 expands to come in contact with the semiconductor devices 210 and contracts to detach the semiconductor devices 210. Such expansion or contraction of each pickup head 250 is performed by injecting or removing fluid into or out of a cavity 255 that communicates with the corresponding fluid channel 240. The pickup head 250 has a bottom surface that can be placed against at least a portion of a top surface of a semiconductor device 210. In some embodiments, the pickup head 250 is made of an elastomeric material (e.g., Polydimethylsiloxane (PDMS), Polyurethane (PU), or some other polymer) that can be deformed in response to injecting or removing of the fluid into or out of the cavity. The elastomeric material may be a polymer with viscoelasticity and/or with weak inter-molecular forces, a low Young's modulus, and/or high failure strain compared with other materials. Accordingly, due to its elastomeric composition, the pickup head 250 expands and bulge when filled with a fluid. In one embodiment, the pickup head 250 is transparent to facilitate alignment of the pickup head 250 with the target substrate 275, via an imaging device placed above the pickup head 250. The pickup head array 230 may operate a plurality of pickup heads 250 individually, such that each of the semiconductor devices 210 can be picked up and placed onto a target substrate independently.

Figure 4:
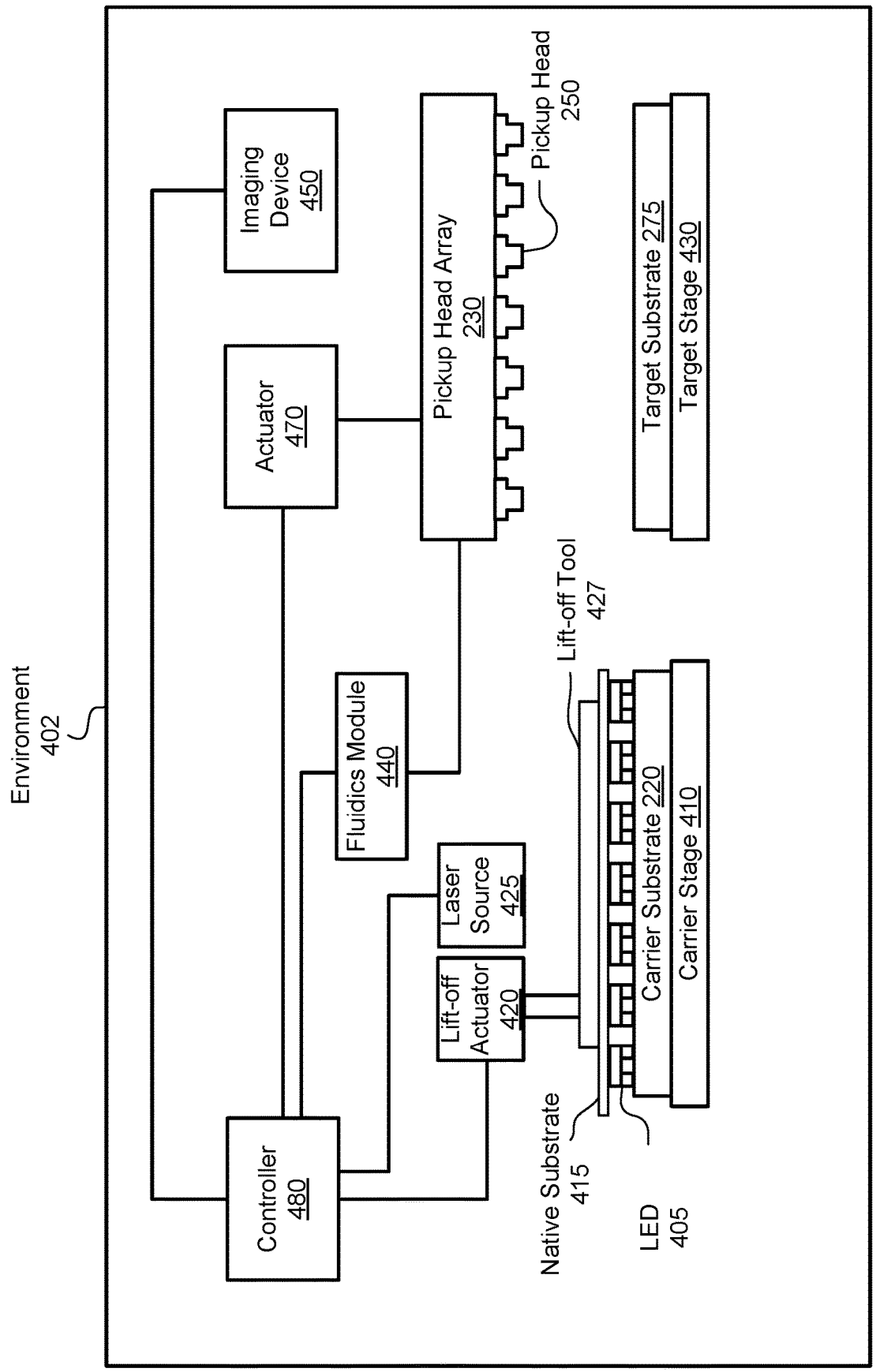
FIG. 4 is a system diagram of a display assembly system, in accordance with an embodiment.

Fluid injected into and removed from the cavity 255 is controlled by a valve 278 that communicates with a fluid source 272 via a pipe 276 (e.g., the fluidics module 440 illustrated in FIG. 4). Control signals 274 from a controller (e.g., the controller 480 illustrated in FIG. 4) cause the valve 278 to open or close the pipe 276. To inject fluid into the pickup head 250, the valve 278 opens, allowing fluid from the fluid source 272 to travel through the pipe 276 and enter the cavity 255. To remove fluid from the pickup head 250, another valve (not shown) opens and enables the fluid to discharge.

Figure 2B:
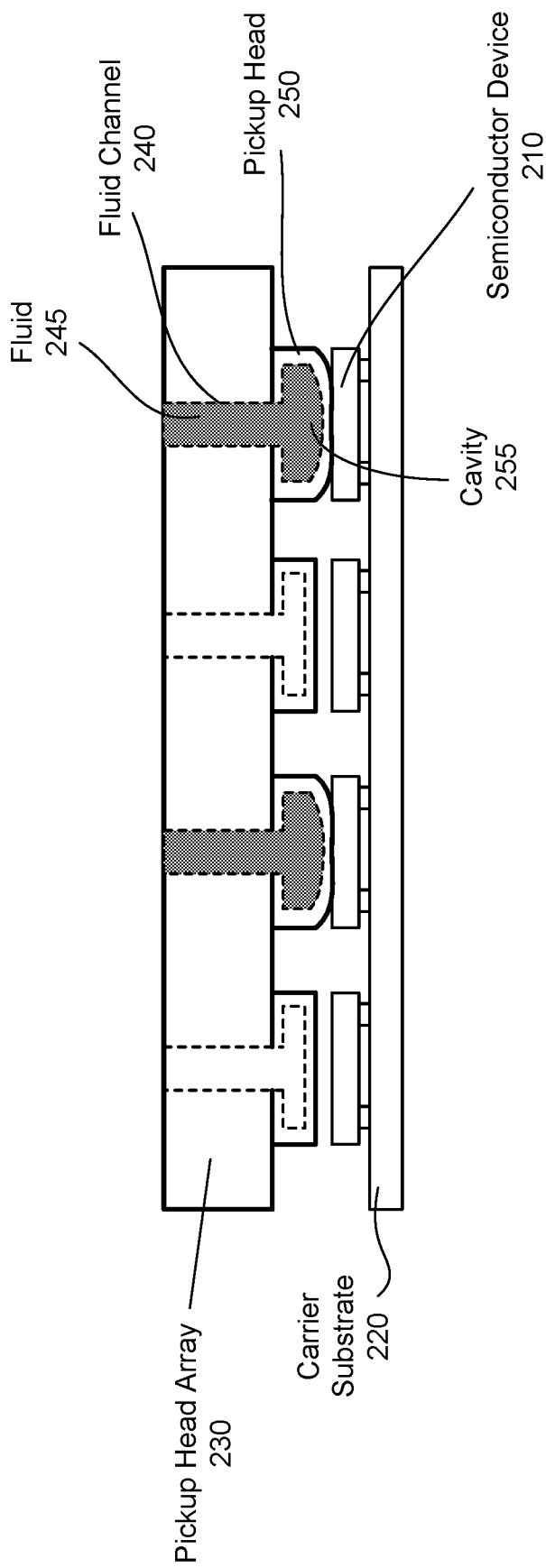
FIG. 2B is a cross-sectional view of the semiconductor devices on the carrier substrate and the pickup head of the pickup head array in an expanded state, in accordance with an embodiment.

FIG. 2B is a cross-sectional view of the semiconductor devices 210 on the carrier substrate 220 and the pickup head 250 of the pickup head array 230 in an expanded state, in accordance with an embodiment. The fluid 245 travels through the fluid channel 240 to reach a cavity 255 of the pickup head 250. The fluid 245 in the cavity of the pickup head 250 causes the pickup head 250 to expand and come into contact with the semiconductor device 210.

Examples of the fluid 245 include air, materials with a low boiling point liquid, a polymer, a flux compound (e.g., used to print on the receiving substrate prior to start of transfer), or some combination thereof. In some embodiments, the fluid 245 may be incompressible, enabling volumetric control of the fluid 245's flow. In other embodiments, the fluid 245 may be compressible, preventing over compression and damage of the semiconductor device 210. The fluid 245 may be a transparent fluidic medium, enabling the system's alignment of the pickup head 250 with the target substrate via an imaging device. For example, the fluid 245 may be transparent at certain wavelengths, enabling visualization of the fluid 250 and the pickup head 250 at those wavelengths.

Figure 2C:
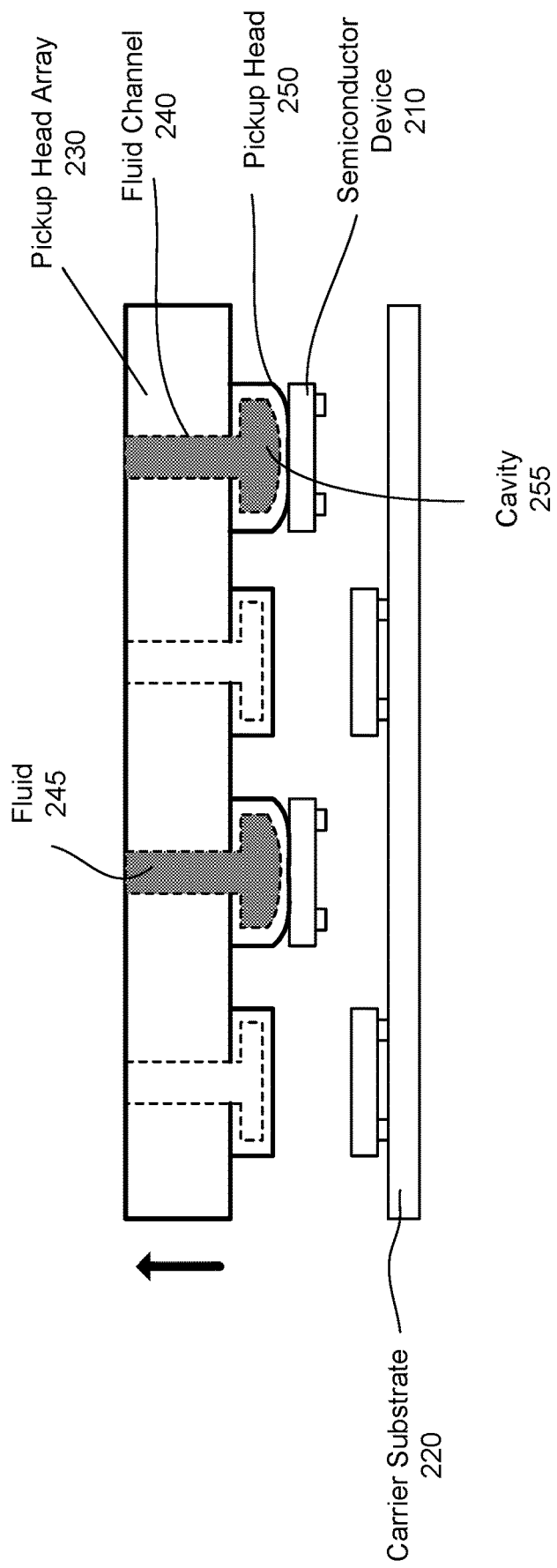
FIG. 2C is a cross-sectional view of the semiconductor devices removed from the carrier substrate, in accordance with an embodiment.

FIG. 2C is a cross-sectional view of the semiconductor devices 210 removed from the carrier substrate 220, in accordance with an embodiment. The fluid 245 enables the removal of the semiconductor device 210 from the carrier substrate 220. The pickup head array 230 may select a subset of the semiconductor devices 210 for expansion by selectively applying the fluid 245 to the pickup heads 250 that correspond with the selected semiconductor devices 210. For example, in FIG. 2C, only two of the four depicted pickup heads 250 are applied with the fluid 245. Accordingly, the two semiconductor devices 210 below the pickup heads 250 filled with the fluid 245 will be removed from the carrier substrate 220.

After the pickup head 250 contacts the semiconductor device 210, the pickup head 250 pulls upward, away from the carrier substrate 220, and overcomes any retention force of the semiconductor device 210 to the carrier substrate 220. Retention forces keeping the semiconductor device 210 coupled to the carrier substrate 220 may include the weight of the semiconductor device 210 and any adhesive forces of the semiconductor device 210 to the carrier substrate 220.

The fluid 245 allows the pickup of the semiconductor device 210, causing the pickup head 250 to deform elastically without irreversibly deforming the pickup head 250 and the semiconductor device 210. When the fluid 245 enters the cavity 255 of the pickup head 250, the pickup head 250 expands and contacts the semiconductor device 210. Electrostatic interactions, such as hydrogen bonding, between the pickup head 250 and the semiconductor device 210 may enable the semiconductor device 210 to temporarily attach to the pickup head 250. In some embodiments, covalent and/or Van der Waal bonding forces may be used.

Figure 2D:
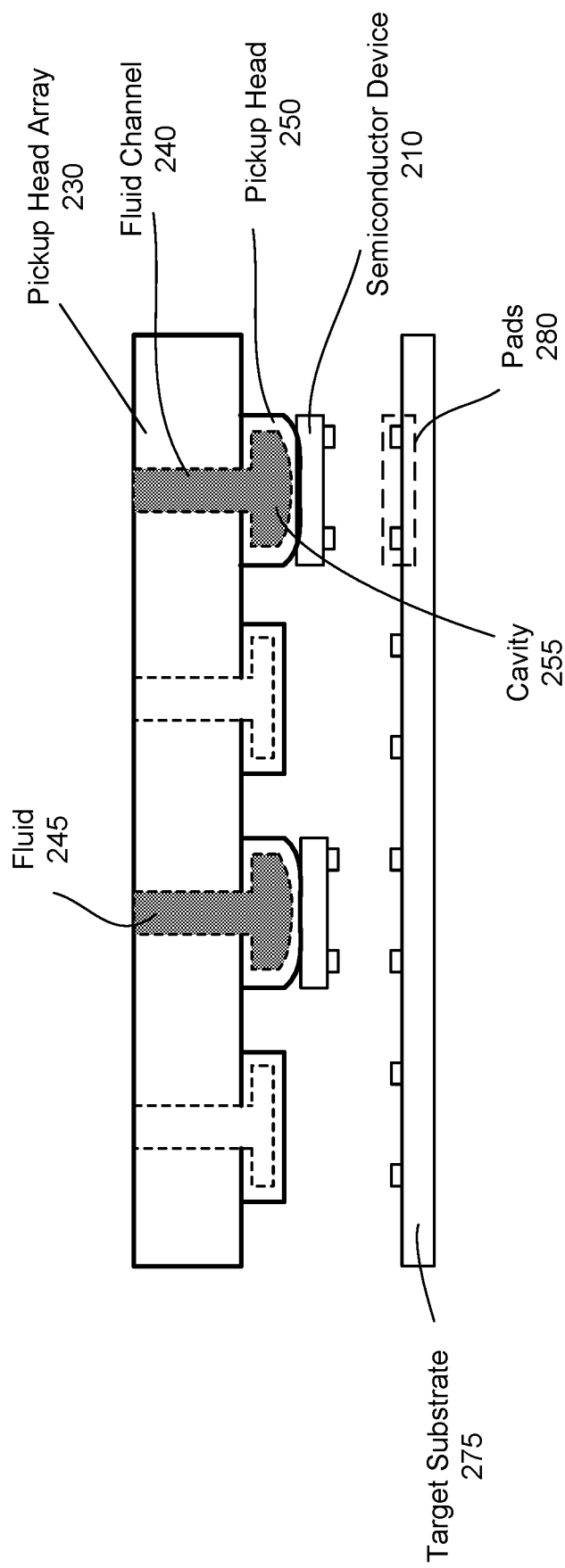
FIG. 2D is a cross-sectional view of the semiconductor devices aligned with a target substrate, in accordance with an embodiment.

FIG. 2D is a cross-sectional view of the semiconductor devices 210 aligned with the target substrate 275, in accordance with an embodiment. The pickup head array 230 is moved onto the target substrate 275 so that the semiconductor devices 210 are aligned with locations on the target substrate 275. In some embodiments, the location on the target substrate 275 is delineated by electrical contact pads 280. Such alignment may be performed using an imaging device 450 placed above the pickup head array 230 to capture the images of the pickup head 250 and the semiconductor device 210 relative to locations on the target substrate 275. The target substrate 275 may be a pixel control circuit of an electronic display, wherein the electrical contact pads 280 power the semiconductor device 210 (e.g., the LED). Each of the electrical contact pads 280 align with an electrode of the semiconductor 210. In some embodiments, the target substrate 275 serves as an intermediate carrier substrate. The semiconductor device 210 may be placed temporarily on the target substrate 275, before being transferred to a final target substrate. A display substrate with pixels for displaying images, for example, may be the final target substrate, and directly bond to the semiconductor device 210.

Figure 2E:
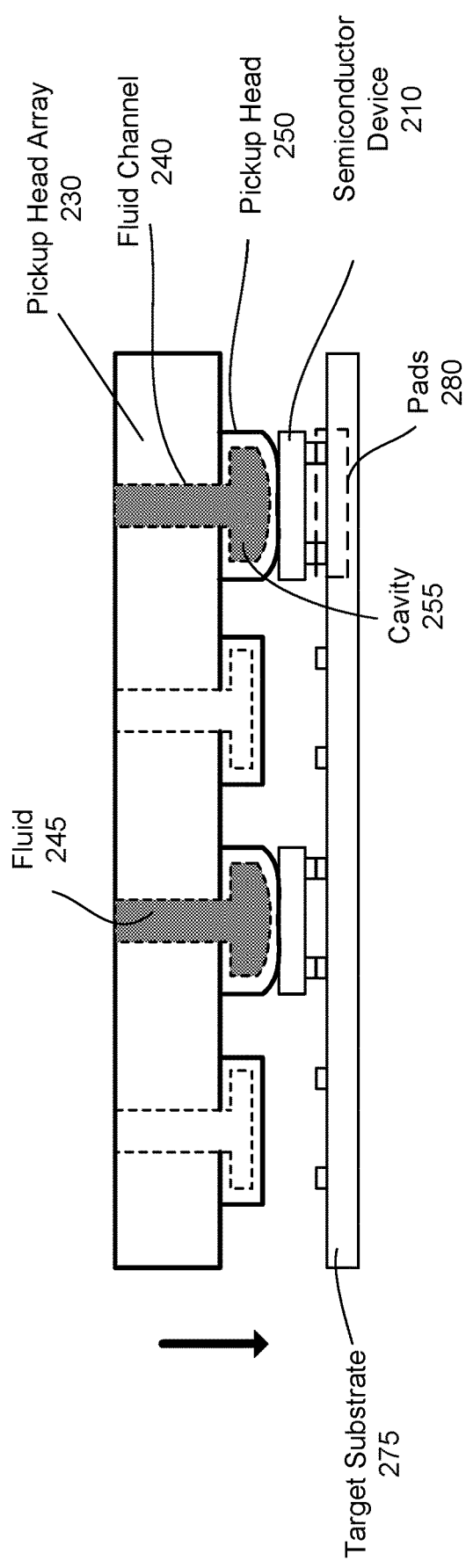
FIG. 2E is a cross-sectional view of the semiconductor devices placed onto the target substrate, in accordance with an embodiment.

FIG. 2E is a cross-sectional view of the semiconductor devices placed onto the target substrate, in accordance with an embodiment. The electrodes of the semiconductor device 210 align and bond with the electrical contact pads 280, such that the semiconductor device 210 mounts to the target substrate 275. The electrodes of the semiconductor device 210 and the electrical contact pads 280 may be bonded via thermal compression. The target substrate 275 may be coupled to a heater that increases a temperature of the electrodes of the semiconductor device 210 as well as the electrical contact pads 280, while the pickup head 250 applies pressures while placing the semiconductor 210 onto the target substrate 275. In some embodiments, a laser may be directed through the pickup head 250 to bond the semiconductor device 210 to the target substrate 275 via laser bonding. For this purpose, the pickup head 250 may be optically transparent and/or translucent to allow the laser beam to pass through. In other embodiments, the LED-electrical contact pad bonding may occur via wire bonding, surface activated bonding, or some combination thereof.

Figure 2F:
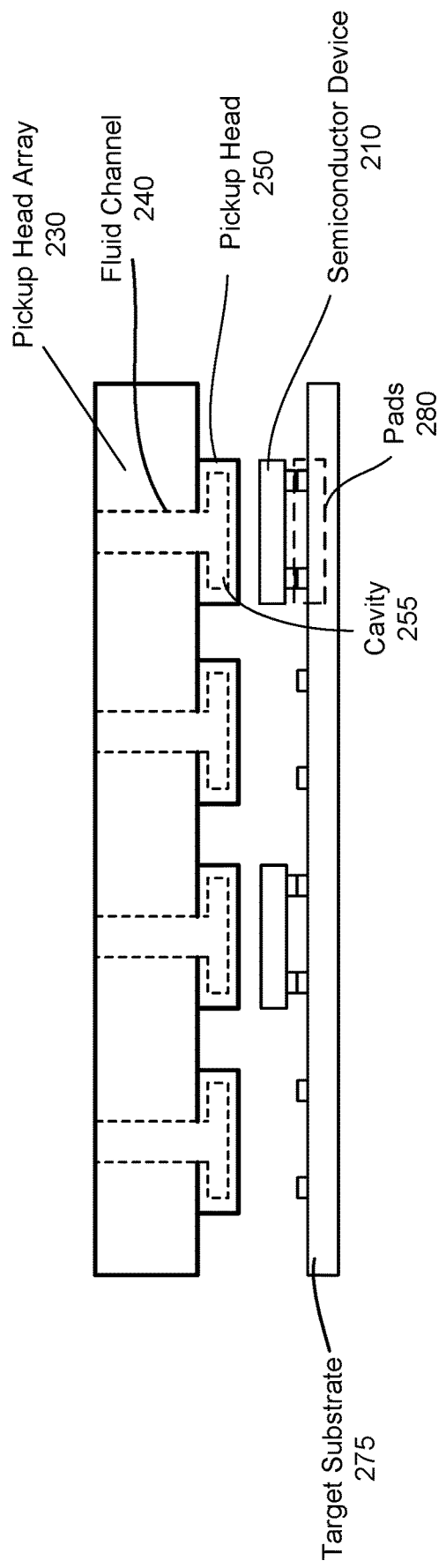
FIG. 2F is a cross-sectional view of the semiconductor devices released onto the target substrate, in accordance with an embodiment.

FIG. 2F is a cross-sectional view of the semiconductor devices 210 released onto the target substrate 275, in accordance with an embodiment. The pickup head array 230 releases the semiconductor devices 210 onto the corresponding electrical contact pads 280. In some embodiments, the semiconductor device assembly system removes at least a portion of the fluid 245 from the fluid channel 240 and the pickup head 250 to separate the pickup head 250 from the semiconductor 210. After removing the fluid 245 from the pickup head 250 and the fluid channel 240, the pickup head 250 contracts, assuming its original shape. The pickup head 250 subsequently separates from the semiconductor device 210, releasing it onto the target substrate 275.

Figure 3:
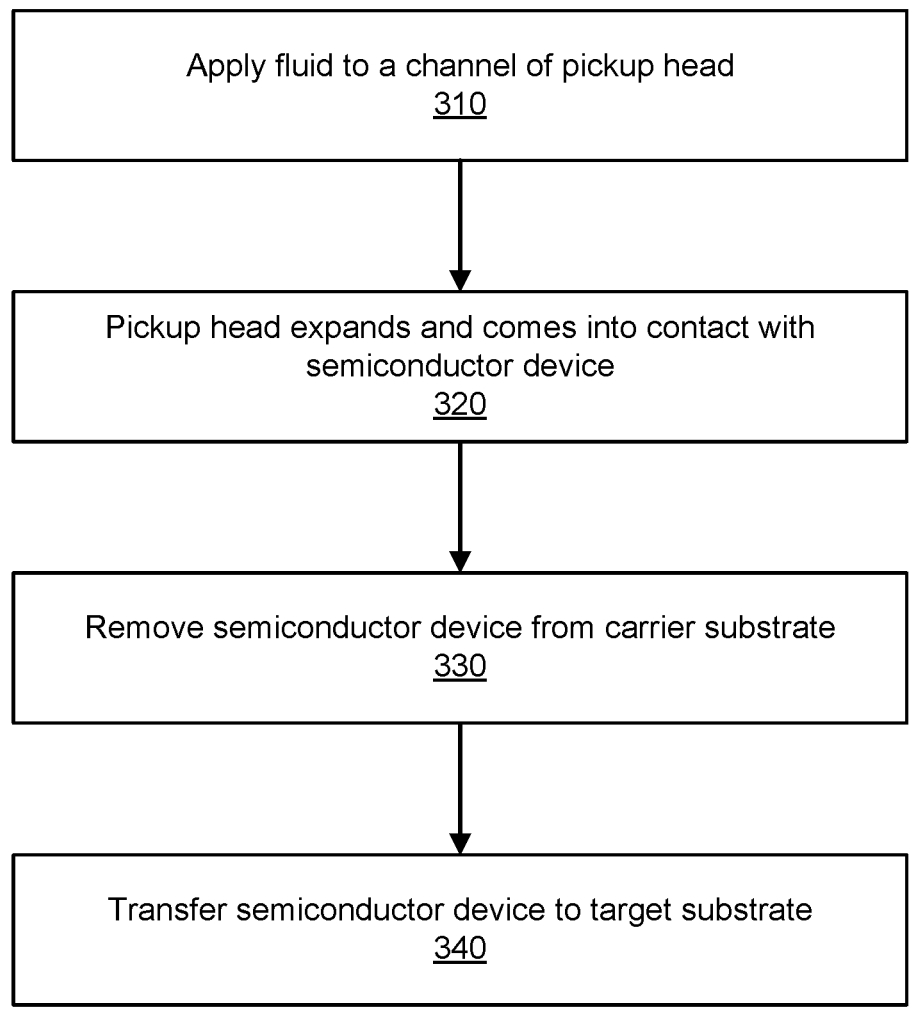
FIG. 3 is a flowchart illustrating a process for removing semiconductor devices from a carrier substrate using fluidics, in accordance with an embodiment.

FIG. 3 is a flowchart illustrating a process for removing semiconductor devices from a carrier substrate using fluidics, in accordance with an embodiment. A semiconductor device assembly system applies 310 a fluid (e.g. the fluid 245) to a channel (e.g., the fluid channel 240) of a pickup head (e.g., the pickup head 250). The fluid originates from a fluid source and a controller determines a volume of the fluid to inject into the pickup head and/or remove from the pickup head.

After the fluid is applied, the pickup head expands and comes into contact 320 with a semiconductor device (e.g., the semiconductor device 210). The semiconductor device assembly system removes 330 the semiconductor device from the carrier substrate (e.g., the carrier substrate 220). Electrostatic interactions, such as those that occur via hydrogen bonding, temporarily bond the semiconductor device with the expanded pickup head, enabling the semiconductor device to be pulled away and picked up from the carrier substrate.

The semiconductor device assembly system transfers 340 the semiconductor device onto a target substrate (e.g., the target substrate 275). The transfer process includes aligning the semiconductor device with a location on the target substrate (e.g., onto the electrical contact pads 280). The semiconductor device bonds with the target substrate, while at least a portion of the fluid is removed from the pickup head. The pickup head contracts, returning to its original shape. No longer in contact with the semiconductor device, the pickup head releases the semiconductor device onto the target substrate. In some embodiments, the target substrate is an intermediate carrier substrate and the semiconductor device is further transferred to a display substrate.

Additional processes not shown in FIG. 3 may also be performed.

Example Display Assembly System

FIG. 4 is a system diagram of a display assembly system, in accordance with an embodiment. The system 400 fabricates a display device by transferring a plurality of light emitting diodes (LEDs) 405 from the carrier substrate 220 to the target substrate 275. Each LED 405 is an embodiment of the LED 100 described in FIG. 1, and accordingly, an embodiment of the semiconductor device 210 described in FIGS. 2A-F. In some embodiments, at least a subset of the LEDs 405 may be different color LEDs. The carrier substrate 220 couples to the LEDs 405 after fabrication of the LEDs 405. The target substrate 275 may be a display substrate, or may be an intermediate carrier substrate that facilitates bonding with a display substrate. The system 400 places the LEDs 405 at pixel locations of the target substrate 275, i.e., a display substrate and bonds the LEDs 405 to the display substrate. In some embodiments, the LEDs 405 are micro LEDs having a reduced divergence of light output and small light emitting area in comparison to conventional LEDs.

The system 400 includes an environment 402 for picking up and placing the LEDs 405. The system 400 further includes the pickup head array 230, a carrier stage 410, a lift-off actuator 420, a laser source 425, a lift-off tool 427, a target stage 430, a fluidics module 440, an imaging device 450, an actuator 470, and a controller 480. In some embodiments, the environment 402 is an interior environment of a scanning electron microscope (SEM) chamber and the imaging device 450 is the SEM. In some embodiments, the components of the environment 402 differ from what is described herein.

The carrier substrate 220 couples to the LEDs 405 post fabrication. The system 400 may include a plurality of carrier substrates 220. For example, different carrier substrates 220 may carry different color LED dies. The carrier substrate 220 may be a carrier tape that adheres to the LEDs 405 after fabrication. Singulated LEDs 405 allows the system 400 to selectively pick up and place the LEDs 405. Selective pickup and placement of the LEDs 405 is useful when a subset of the LEDs 405 is defective and/or unwanted, for example. The carrier substrate 220 enables the singulation of the LEDs 405, such as by expanding and spatially separating a plurality of the LEDs 405. In some embodiments, singulation occurs via a laser beam (e.g., from the laser source 425) that heats the carrier substrate 220 and reduces adhesion forces between the LEDs 405 and the carrier substrate 220.

The carrier stage 410 holds the carrier substrate 220 and facilitates the precise alignment of the LEDs 405 with the pickup head array 230. The carrier stage 410 may be adjusted in position and height, and can be moved with three degrees of freedom. The degrees of freedom may include left and right, backward and forward, and a yaw rotational degree of freedom. The carrier substrate 220 is moved along with the carrier stage 410.

After fabrication, the LEDs 405 are coupled to a native substrate 415. The native substrate 415 may be a sapphire substrate and/or a gallium arsenide substrate.

The laser lift-off actuator 420 facilitates the removal of the native substrate 415 from the LEDs 405. The process of detaching the native substrate 415 is referred to herein as a laser lift-off (LLO) operation. The lift-off actuator 420 works with the laser source 425 and the lift-off tool 427 to perform the LLO operation. The laser source 425 emits a light that passes through the native substrate 415 layer to weaken the bond between the LEDs 405 and the native substrate 415. The emitted light may be a pulse ultraviolet laser, which passes through a native substrate 415 made of sapphire substrate, or an infrared laser, which passes through a native substrate 415. The laser light from the laser source 425 is absorbed by a gallium semiconductor layer of the LEDs 405, thus causing a portion of the gallium semiconductor layer to separate into its component elements. Thus, the laser weakens the bond between the gallium semiconductor layer of the LEDs 405 and the native substrate 415. After the bond has been weakened and the gallium semiconductor layer of the LEDs 405 is separated from the native substrate 415, the lift-off actuator 420 removes the native substrate 415 via the lift-off tool 427.

In some embodiments, the laser source 425 also facilitates the singulation of the LEDs 405 by heating the carrier substrate 220 to reduce an adhesive force between the carrier substrate 220 and the LEDs 405.

The pickup head array 230 transfers the LEDs 405 from the carrier substrate 220 to the target substrate 275. The pickup head array 230 includes a housing formed with at least one fluid channel. At a bottom side of the housing, the pickup head array 230 includes at least one pickup head 250. Each pickup head 250 includes a cavity that communicates with the fluid channel. In some embodiments, the pickup head array 230 includes a plurality of pickup heads 250, each of which include a cavity that communicates with a fluid channel. In some embodiments, the fluid channels of each pickup head 250 communicate with one another, allowing fluid to flow between pickup heads 250 and the corresponding fluid channels. The pickup head array 230 accordingly enables selective pickup of the LEDs 405 from the carrier substrate 220. The pickup head array 230 aligns the pickup heads 250 holding the LEDs 405 with the target substrate 275, places the LEDs 405 onto the target substrate 275, and subsequently releases them. In some embodiments, the system 400 includes multiple pickup head arrays 230, each positioned at a separate station. Each station may be dedicated to the pick and place of a particular color LED, such as a green station for green LEDs, a red station for red LEDs, and a blue station for blue LEDs, etc.

The target stage 430 holds the target substrate 275. The target stage 430 facilitates the precise alignment of the LEDs 405 with the target substrate 275. Accordingly, the target stage 430 may be adjusted in position and height, and can be moved with three degrees of freedom. The degrees of freedom may include left and right, backward and forward, and a yaw rotational degree of freedom. The target substrate 275 is moved along with the target stage 430. In some embodiments, the target stage 430 also includes a heater to facilitate the thermal compressive bonding of the LEDs 405 to the target substrate 275.

The fluidics module 440 provides fluid (e.g., the fluid 245) to the pickup head array 230, thereby facilitating the pickup of the LEDs 405. The fluidics module 440 may apply the fluid to a subset of the pickup heads 250 of the pickup head array 230. As discussed with respect to FIGS. 2B-E, the fluid is applied to a fluid channel of the pickup head 250, travels to a cavity within the pickup head 250, and causes the pickup head 250 to expand. The expanded pickup head 250 makes contact with and attaches to the LED 405, allowing the LED 405 to be removed from the carrier substrate 220.

The fluidics module 440 receives instructions from the controller 480 on the volume of fluid to apply to and remove from the pickup head array 230. The controller 480, in some embodiments, provides a control signal (e.g., the control signal 274) to open and/or close valves (e.g., the valve 278) connecting pipes (e.g., the pipe 276) to a fluid source (e.g., the fluid source 272). The controller 480 may instruct the fluidics module 440 to apply the fluid to the pickup head array 230 to cause the pickup head 250 to expand. The controller 480 may specify a volume of the fluid to apply to the pickup head 250. For example, the volume of the fluid may be approximately equal to the volume of the fluid channel of the pickup head 250. The controller 480 may also instruct the fluidics module 440 to remove at least a portion of the fluid from the pickup head array 230, causing the pickup head 250 to contract. Subsequently, the pickup head 250 separates from the LED 405, releasing it onto the target substrate 275.

The imaging device 450 facilitates a visual alignment for LED 405 pickup from the carrier substrate 220 and placement onto the target substrate 275. For example, the imaging device 450 generates images of the pickup head array 230 and the carrier substrate 220, and provides the images to the controller 480. The controller 480 accordingly aligns the one or more pickup heads 250 of the pickup head array 230 with the carrier substrate 220 based on the images, and picks up one or more LEDs 405 from the carrier substrate 220. As another example, the imaging device 450 generates images of the one or more pickup heads 250 of the pickup head array 230 and the target substrate 275, and provides the images to the controller 480. The controller 480 aligns the one or more pickup heads 250 with the target substrate 275 based on the images, and places the LEDs 405 attached to the one or more pickup heads 250 on the target substrate 275. Each pickup head 250 may be optically translucent, transparent, or some combination thereof, allowing the imaging device 450 to capture the alignment of the pickup head 250 through the pickup head 250 itself. In some embodiments, the fluid applied to the pickup head 250 may also be optically translucent, transparent, or some combination thereof.

In some embodiments, the imaging device 450 is an environmental scanning electron microscope (ESEM) to provide images without specimen coating. In these embodiments, the environment 402 is an ESEM chamber including a high pressure atmosphere of water vapor. The use of an SEM is advantageous for picking and place small semiconductor device, such as micro LED dies. In various embodiments, other types of imaging devices may be used to facilitate the alignments.

The actuator 470 is an electro-mechanical component that controls the movement of the pickup head array 230 based on instructions from the controller 480. For example, the actuator 470 may move the pickup head array 230, or individual pickup heads 250, with three degrees of freedom including up and down, left and right, and forward and back. In various embodiments, the actuator 470 may be, for example, a rotating motor, a linear motor, or a hydraulic cylinder.

In some embodiments, the controller 480, in addition to controlling an alignment of the pickup heads 250 of the pickup head array 230 (e.g., using actuators 470) and the injection and/or removal of the fluid from the pickup heads 250 (e.g., via the fluidics module 440), may also control a temperature of the environment 402. In some embodiments, the controller 480 may alter the temperature of the environment 402 to change a temperature of the LEDs 405. For example, the controller 480 may operate one or more heating coils (not shown) in the environment 402 to raise a temperature of the LEDs 405. In other embodiments, the carrier stage 410 or other component may contain a heater able to directly heat one or more of the LEDs 405. In some embodiments, the temperature of the environment 402 is controlled using a separate temperature controller (not shown).

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
    applying fluid to a channel of a deformable solid pick-up head causing the pick-up head to expand to contact a semiconductor device on a carrier substrate and attach to the semiconductor device; and
    removing the semiconductor device from the carrier substrate by lifting the pick-up head with the semiconductor device attached to the pick-up head away from the carrier substrate.

2. The method of claim 1, further comprising:
    aligning the semiconductor device attached to the pick-up head with a location on a target substrate;
    removing the fluid from the channel of the pick-up head to separate the semiconductor device from the pick-up head; and
    placing the semiconductor device at the location on the target substrate.

3. The method of claim 2, wherein:
    the carrier substrate is a carrier tape; and
    the method further includes:
        fabricating a plurality of semiconductor devices including the semiconductor device on a native substrate;
        transferring the plurality of semiconductor devices to the carrier tape;
        singulating the plurality of semiconductor devices on the carrier tape; and
        spatially separating the plurality of semiconductor devices by expanding the carrier tape.

4. The method of claim 3, wherein the plurality of semiconductor devices are singulated by a laser beam directed through the carrier tape, the laser beam heating the carrier tape to reduce an adhesion force between the semiconductor device and the carrier tape.

5. The method of claim 3, wherein:
    the target substrate is a display substrate; and
    the semiconductor device is a light emitting diode (LED).

6. The method of claim 2, wherein:
    the target substrate is an intermediate carrier substrate; and
    the method further includes transferring the semiconductor device on the intermediate carrier substrate to a display substrate using a direct bonding process.

7. The method of claim 2, wherein the pick-up head is composed of an elastomeric material.

8. The method of claim 1, further comprising:
    selecting a subset of pick-up heads from an array of pick-up heads including the pick-up head; and
    applying fluid to a channel of each of the selected pick-up heads causing each selected pick-up head to expand to contact a semiconductor device of a subset of semiconductor devices on a carrier substrate to attach a semiconductor device to a pick-up head.

9. The method of claim 8, further comprising:
    aligning the subset of semiconductor devices attached to the array of pick-up heads with a plurality of locations on a target substrate; and
    removing the fluid from each channel of the subset of pick-up heads to separate the subset of semiconductor devices from the subset of pick-up heads at the plurality of locations on the target substrate.

10. The method of claim 8, further comprising, prior to applying the fluid, aligning the subset of pick-up heads with the subset of semiconductor devices on the carrier substrate by expanding the carrier substrate to spatially separate the semiconductors devices.

11. A pick-up head array, comprising:
    a housing formed with a fluid channel; and
    a deformable solid pick-up head at a side of the housing, the pick-up head formed with a cavity that communicates with the fluid channel, the pick-up head configured to receive fluid via the fluid channel for expanding and contacting a semiconductor device.

12. The pick-up head array of claim 11, wherein the pick-up head is composed of an elastomeric material.

13. The pick-up head array of claim 11, further comprising one or more pick-up heads at the side of the housing, the one or more pick-up heads formed with cavities that communicate with other fluid channels formed in the housing.

14. A display panel fabricated by a method, comprising:
applying fluid to a channel of a deformable solid pick-up head causing the pick-up head to expand to contact a light emitting diode (LED) on a carrier substrate;
removing the LED from the carrier substrate by lifting the pick-up head with the LED attached to the pick-up head away from the carrier substrate;
aligning, with the pick-up head, the LED with a location on a target substrate; and
removing the fluid from the channel of the pick-up head to separate the LED from the pick-up head and place the LED at the location on the target substrate.

15. The display panel of claim 14, wherein:
the target substrate is a display substrate of the display panel; or
the target substrate is an intermediary carrier substrate, the LED is transferred to the display substrate from the intermediary carrier substrate using a direct bonding process.

* * * * *